(12) United States Patent
Guo et al.

(10) Patent No.: US 6,746,805 B1
(45) Date of Patent: Jun. 8, 2004

(54) METHODS FOR FABRICATING LITHOGRAPHY APPARATUS

(75) Inventors: Cheng Guo, New Providence, NJ (US); Stephen Moffatt, New York, NY (US)

(73) Assignee: Applied Materials, Inc., Santa Clara, CA (US)

( * ) Notice: Subject to any disclaimer, the term of this patent is extended or adjusted under 35 U.S.C. 154(b) by 278 days.

(21) Appl. No.: 09/698,706

(22) Filed: Oct. 27, 2000

(51) Int. Cl.[7] .................................................. G03F 9/00
(52) U.S. Cl. ......................................................... 430/5
(58) Field of Search .......................... 430/5, 322, 323, 430/324; 378/34, 35

(56) References Cited

U.S. PATENT DOCUMENTS

| | | | | |
|---|---|---|---|---|
| 4,827,138 A | * | 5/1989 | Randall | 250/492.2 |
| 5,899,728 A | * | 5/1999 | Mangat et al. | 438/459 |
| 6,168,890 B1 | * | 1/2001 | Takahashi | 430/5 |

OTHER PUBLICATIONS

Article entitled "New approach to projection–electron lithography with demonstrated 0.1 um linewidth" by S.D. Berger et al., Applied Physics Letters, 57 (2), Jul. 1990, pp. 153–155.
Article entitled "Projection electron–beam lithography: A new approach", by S.D. Berger et al., J. Vac. Sci. Technol. B 9 (6), Nov./Dec. 1991, pp. 2996–2999.

* cited by examiner

Primary Examiner—Mark F. Huff
Assistant Examiner—Saleha R. Mohamedulla
(74) Attorney, Agent, or Firm—Shirley L. Church

(57) ABSTRACT

A method for forming a mask assembly for use in lithography, typically electron-beam lithography, first forms in a substrate one half of a plurality of opening therethrough and then fills the openings with a removable fill material. Thereafter are formed the other half of the openings which are then filled with the removable fill material. After all the openings have been formed and filled, a support membrane is formed over the substrate and covers the filled windows. A mask layer is then formed over the membrane and patterned. The fill is then removed from all of the windows.

20 Claims, 17 Drawing Sheets

METHODS FOR FABRICATING LITHOGRAPHY APPARATUS

CROSS-REFERENCE TO RELATED APPLICATIONS

This application is related to U.S. Ser. No. 09/698994, Oct. 27, 2000, entitled "Methods For Fabricating Stencil Masks", which has a common assignee and one common inventor and is being filed concurrently with this application.

FIELD OF THE INVENTION

This invention relates to lithography, and more particularly, to masks used in lithography and mask support structures and their preparation.

BACKGROUND OF THE INVENTION

As the size of electronic components used in integrated circuits has shrunk and their density in circuits increased, there has been growing interest in electron beam lithography. In electron beam lithography, an electron beam is used to write patterns on an electron beam resist layer formed over a top surface of the semiconductor wafer that is the workpiece for the electron beam lithography. A particular form of electron beam lithography of special interest for the invention is described as Scattering With Angular Limiting Projection Electron Beam Lithography ("Scalpel").

Scalpel Is an electron beam lithography technique that typically has employed masks in which the mask used for control in the irradiation of the workpiece has been formed as a thin patterned coating supported on a thin membrane. Scalpel has been described in various publications.

The requirements for such a membrane-mask combination are quite demanding. Typically, it needs to be planar, relatively easy to make, and comparatively rugged. A particular problem has been the forming of the membrane that is to support the coating in which the mask pattern is formed. The membrane needs to be of relatively large area, typically at least several inches on a side, to be practical for use in large scale manufacture. It needs also to be very thin, typically no thicker than about 1000 Angstroms in thickness, to permit electrons that pass through the mask to penetrate it easily without excessive scattering or experiencing excessive loss in electron beam energy. Moreover, it also needs to remain planar with inappreciable sag in use so that it continues to support the mask uniformly over its entire area.

To insure that the membrane remains sag-free, it is generally the practice to suspend the membrane by a substrate that provides a suitable underlying support grillage, typically consisting of major struts and minor struts (ribs).

Hitherto, for forming the grillage for supporting the membrane that supports the mask coating, a layer of silicon nitride was deposited over the top surface of a silicon wafer and then the silicon wafer was etched to leave a portion thereof to provide the supporting grillage for the nitride coating that was to serve as the membrane. However, this has proven difficult.

One problem with this approach has been the difficulty of maintaining, during the shaping of the silicon wafer, the mechanical stability of the grillage left to support nitride the membrane. The physical dimensions of commercially available silicon wafers limits formation of thin struts needed.

The present invention involves a better way to prepare a mask useful in electron beam lithography.

SUMMARY OF THE INVENTION

In a first aspect the invention is a method for forming a mask assembly for use in lithography. The method comprises the steps of: forming a support structure that comprises a substrate that includes a plurality of windows filled with a temporary fill; forming over the filled-windowed substrate a mask; and removing the temporary fill.

In a second aspect the present invention is a method for forming a mask assembly for use in lithography. The method comprises the steps of: forming a support structure that comprises a substrate that includes a plurality of windows filled with a temporary fill; forming over the filled-windowed substrate a membrane layer for supporting the mask layer; forming a mask layer over the membrane layer; and removing the temporary fill.

In a third aspect the invention is a method of forming a mask assembly that comprises the steps of: forming in a substrate a supports structure, which includes major and minor struts that define an array of windows in a two-dimensional array of rows and columns, by successive rounds of cutting in the substrate a fraction of the total window area to be formed; filling such fraction of windows with temporary fill before the succeeding round of cutting and filling until all the window areas are cut and filled; forming a membrane layer over a top surface of the support structure; forming a mask layer over the membrane layer; and removing the fill from the windows.

In a fourth aspect the present invention is a method of forming a mask assembly for use in electron beam lithography that comprises the steps of: forming in a substrate a first set of spaced-apart windows; filling the windows with a temporary fill; forming in the substrate a second set of windows in the spaces between the first set of windows for forming with the first set a two-dimensional array of windows arranged in row and columns; filling the second set of windows with a temporary fill; depositing over the filled-windowed substrate a layer suitable for supporting a mask; depositing over the last-mentioned layer a layer suitable for providing a mask; patterning the last-mentioned layer to form a mask, and removing the temporary fill from the windows, whereby the mask layer is free of underlying substrate.

In a fifth aspect the present invention is a method for forming a mask assembly comprising the steps of: forming by use of a mold a support structure that defines an array of windows arranged in rows and columns; filling the openings with a temporary fill; forming over the support structure a membrane layer; forming over the membrane layer a patterned mask; and removing the temporary fill.

In a sixth aspect the invention is a method of forming a mask support structure that comprises the steps of: forming in a substrate a first set of spaced apart windows; filling the first set of windows with a temporary fill; forming in the substrate a second set of windows located in portions of the substrate between the first set of filled windows; and filling the second set of windows with a temporary fill.

In a seventh aspect the invention is a method of forming a mask support structure that comprises the steps of: placing in a mold which is shaped to facilitate the formation of a support structure a plurality of parallel minor struts; and forming in the mold a mask support structure that comprises a frame and plurality of major struts that are orthogonal and attached to the minor struts with the major and minor struts defining a plurality of windows arranged in a two dimensional array of rows and columns.

From a product aspect, the invention is the product of the various methods described.

The invention will be better understood from the following more detailed description in conjunction with the accompanying drawing and claims.

The drawings are not necessarily to scale.

DETAILED DESCRIPTION OF THE INVENTION

Figure 1:
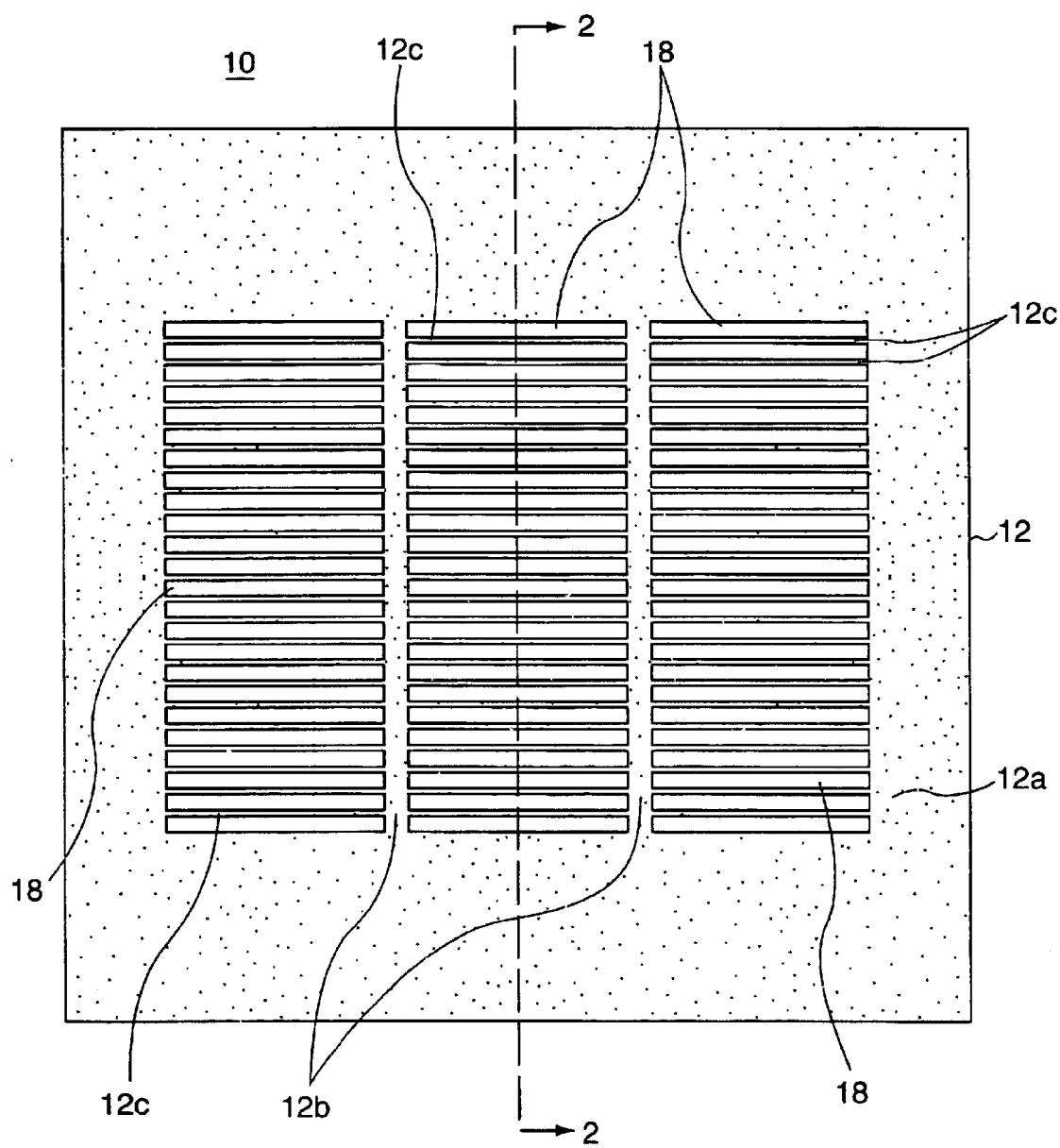
FIG. 1. shows a top view of a mask support structure in accordance with the invention suitable for use in electron beam lithography.
Figure 2:
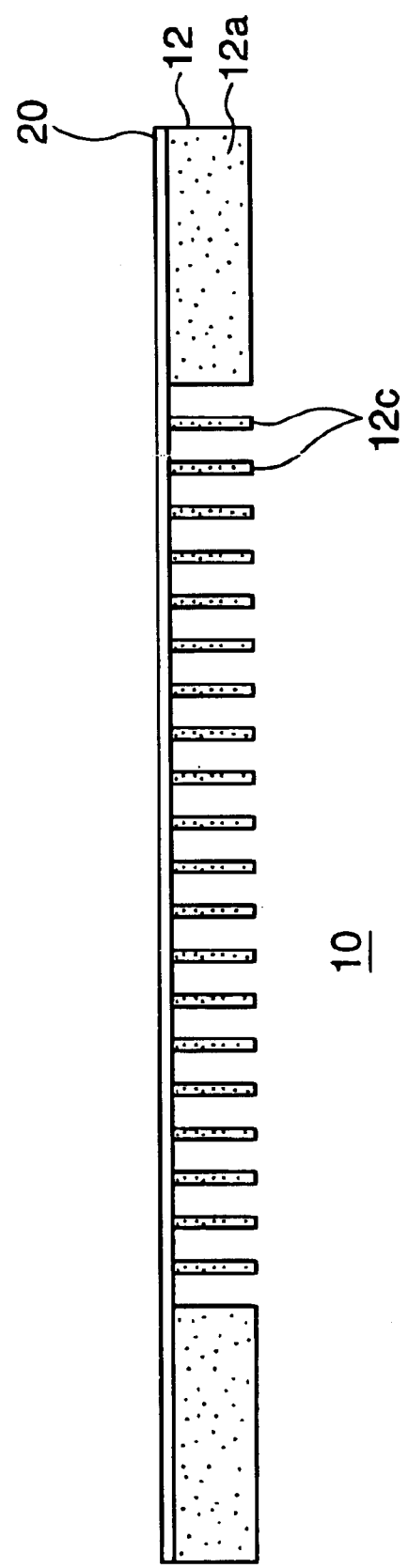
FIG. 2 shows a cross-sectional view taken along a dashed line 2—2 of FIG. 1 with a membrane layer over the mask support structure.

Referring now to FIGS. 1 and 2, there is shown a mask support structure 10 for use in electron beam-lithography in accordance with the invention with FIG. 1 showing a top view and FIG. 2 showing a cross-sectioned view through a dashed line 2—2 of FIG. 1. Mask support structure 10 comprises a substrate 12 having an outer frame portion 12a, advantageously of square shape, major struts 12b, and minor struts 12c. The outer frame portion 12a can be any shape, for example, circular. The major struts are vertical regions and the minor struts are horizontal regions. Major struts 12b and minor struts 12c are orthogonal to each other and define a plurality of windows (openings) 18, arranged in an array of rows and columns. The major struts 12b are at least several times thicker than the minor struts 12c.

As seen in the cross-sectioned view of FIG. 2, over a top surface of the mask support structure is a thin membrane layer 20 that is to support a layer (not shown) that will have been patterned to serve as a mask layer. Mask support structure 10 with the membrane layer 20 on top thereof and a patterned mask layer 28 (shown in FIGS. 9–14) over the membrane layer 20 may be denoted as a mask assembly. The mask layer typically is of a material and thickness to scatter electrons to sufficient angles that it intercepts where unpatterned to be useful in electron beam lithography, but allows electrons to pass through the openings in the pattern little impeded. The membrane 20 needs be of a material and thickness adequate to support the mask layer without sagging but to little affect the passage of electrons therethrough.

Figure 3:
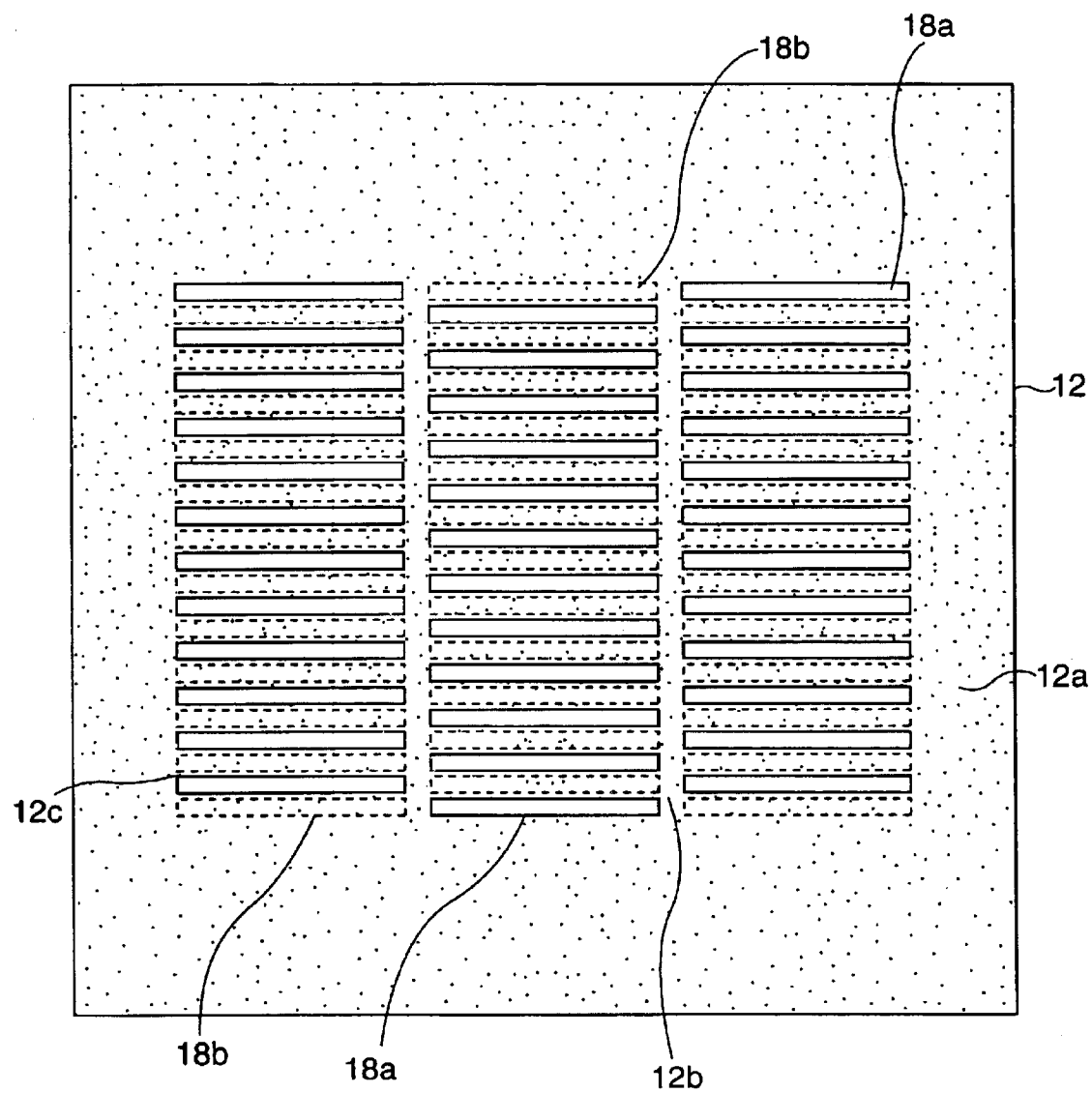
FIGS. 3, 4, 5, and 6 show steps in the fabrication of the mask support structure of FIG. 1.

In accordance with the invention, the mask support structure assembly 10 is prepared in a novel fashion. To this end, as is shown in FIG. 3 there is provided a substrate 12 of a suitable material and advantageously a ceramic, such as aluminum oxide or silicon carbide, of sufficient thickness to be rigid and self supporting, in which are shown by solid lines a first set of windows 18a that are cut in a first round of cutting. In this first round, there are cut one half of the total number of windows to be cut. Advantageously all the windows to be cut are to form a two-dimensional array in rows and columns, as shown in FIG. 1, and in this first round, there are cut alternate windows 18a in each row and column as is denoted by the solid lines. Also shown in FIG. 3 by dashed lines are the regions where windows 18b of the second set that are to be cut in the second round of cuttings. These will form with the first set 18a the two-dimensional array of windows. In one example the windows 18a and 18b are each about 12 millimeters by 1.1 millimeters, and are formed by laser cutting.

Figure 4:
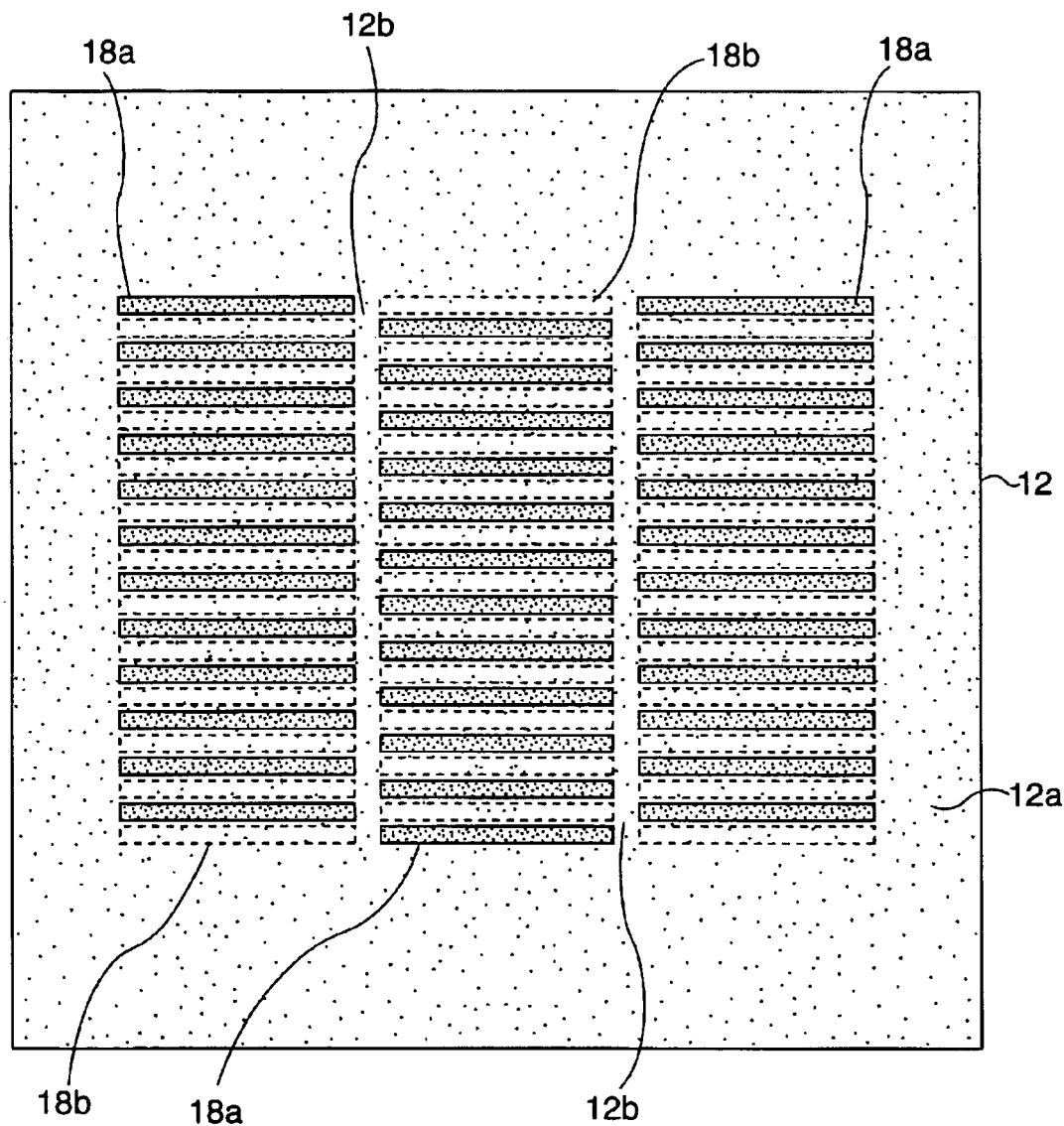

After the first set of half of the window pattern has been cut out to form windows 18a, these windows 18a are temporarily filled with a suitable material that can later be conveniently introduced and later conveniently removed, advantageously an epoxy, silicon oxide, a polymer, or a metal such as aluminum. The result is seen in FIG. 4 where the first set of filled window regions 18a is shown stippled.

Figure 5:
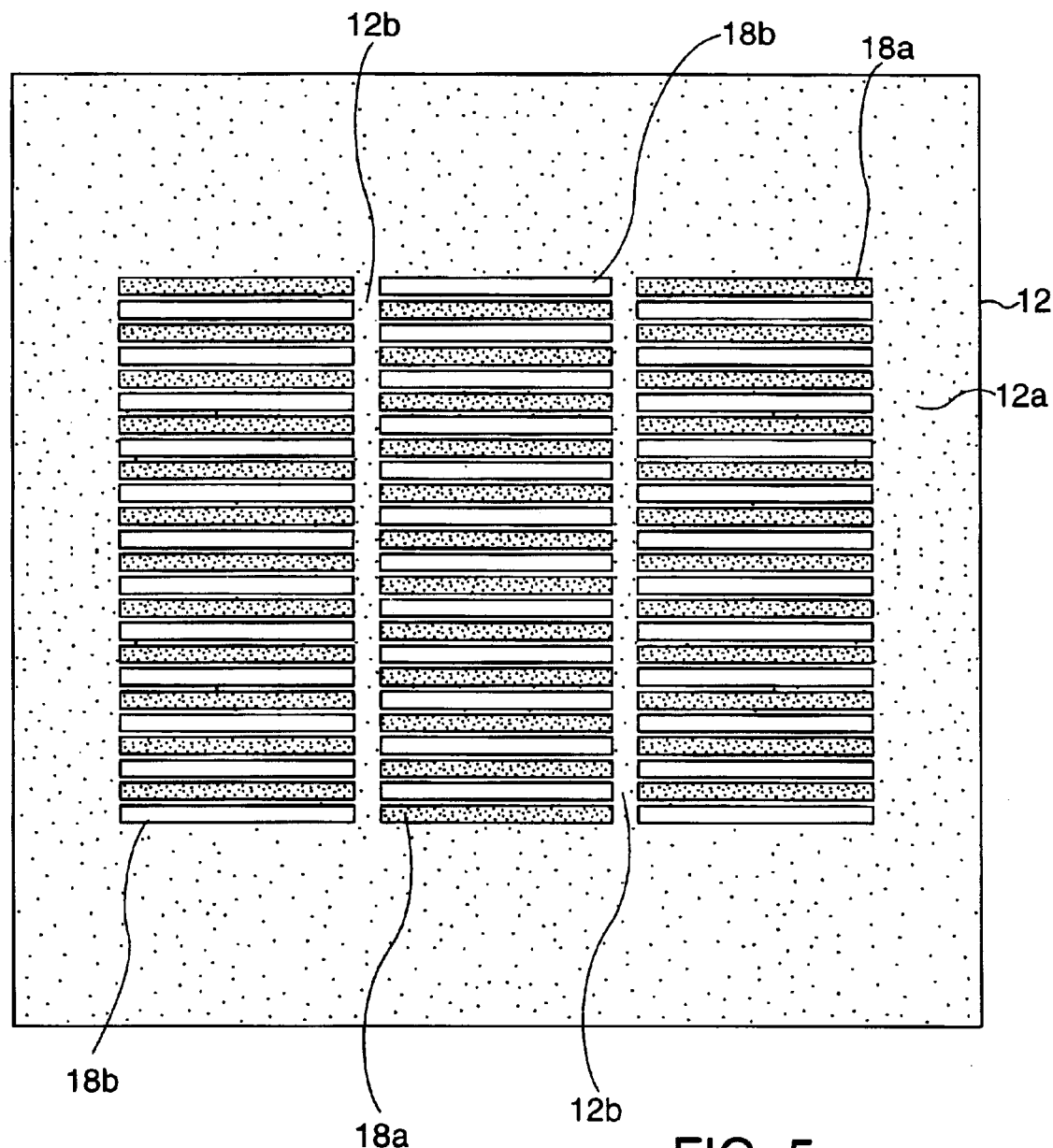

Next there are cut out the remaining windows 18b of the second set, as is shown in FIG. 5, typically in the same manner as before.

Figure 6:
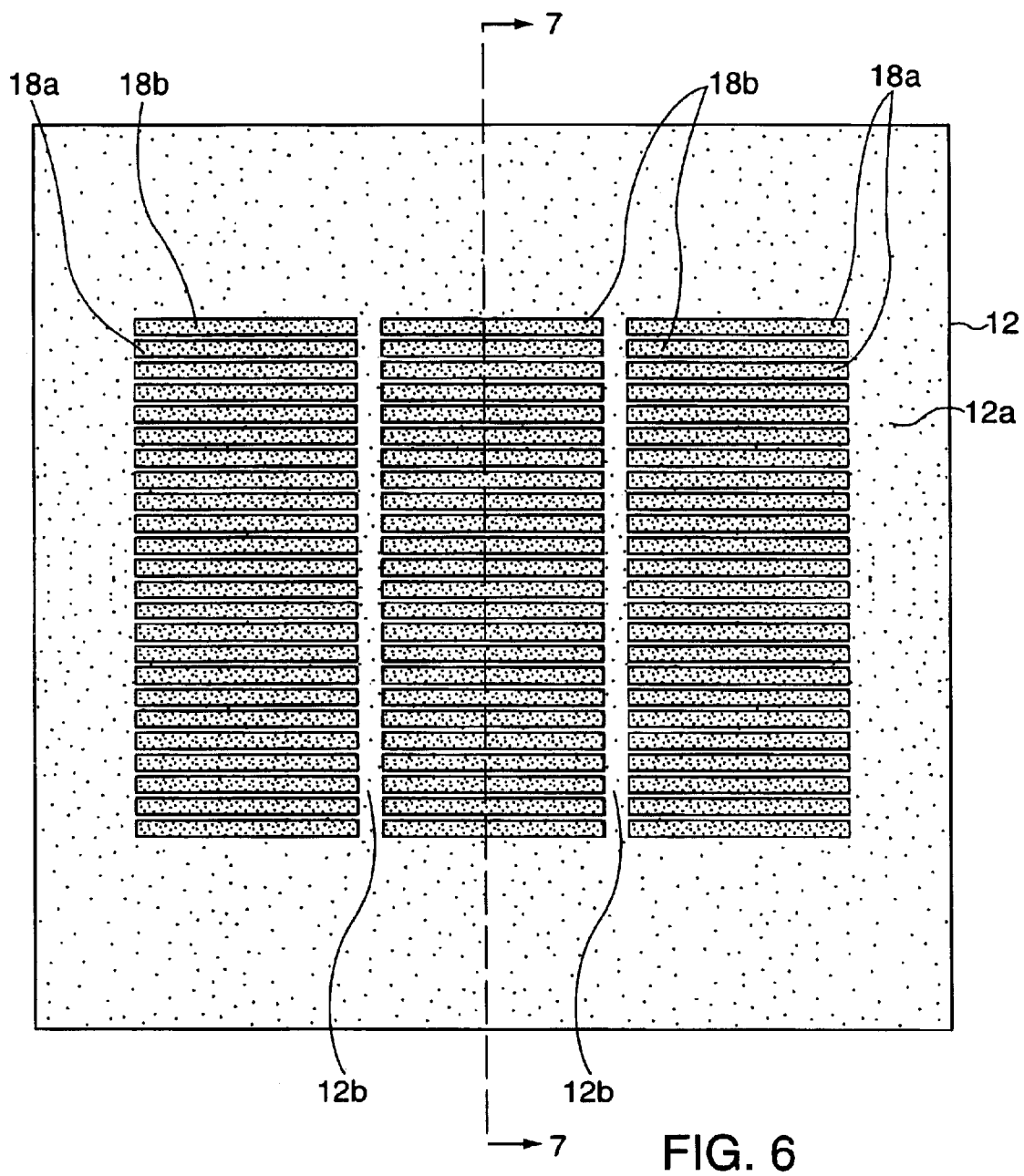

Then the second set of windows 18b are filled typically in the manner used previously to fill the first set. The result is shown in a top view in FIG. 6 and in a cross-sectional view through a dashed line 7—7 of FIG. 6 in FIG. 7. All of the window regions 18a and 18b are shown filled, as is indicated by the stippling in both windows 18a and 18b.

Next, the opposite major surfaces of windowed substrate 12 are ground and polished to provide a mask support structure with smooth, planar, and parallel opposite major surfaces. This can be done, for example, by chemical mechanical polishing (CMP).

As mentioned earlier, there are various ways consistent with the invention in which the membrane layer 20 that will support a mask layer 28 can be provided on the mask support structure 10.

Figure 8:
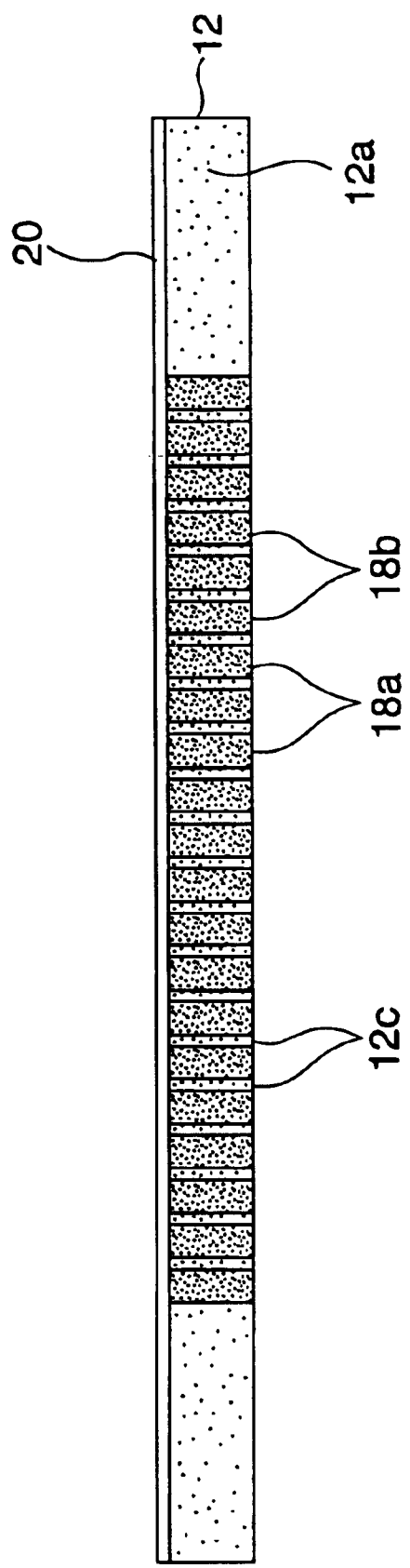
FIG. 8 shows the section of FIG. 7 after there has been deposited a membrane over a top surface thereof.

In one method there is deposited, typically by chemical vapor deposition, over a major surface of the mask support structure 10 a layer of the material that will form a membrane layer 20 for supporting the mask layer 28 (shown in FIGS. 9–14), as is shown in the cross-section view of FIG. 8. Suitable membrane materials include silicon nitride, silicon, silicon carbide, diamond, and aluminum oxide. The membrane should be of a thickness sufficient to adequately support the mask layer but to little impede the passage therethrough of electrons that pass through the patterned mask layer. A thickness of 1000 Angstroms or less should be suitable.

Figure 9:
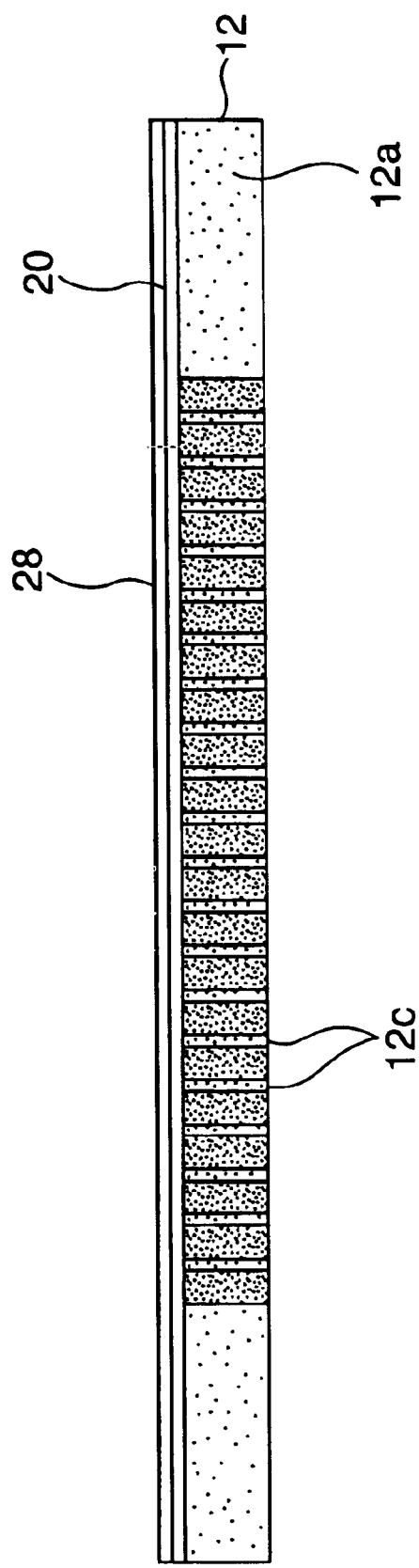
FIG. 9 shows the section of FIG. 8 after there has been deposited over the membrane a layer that will be patterned to serve as the mask for electron-beam lithography.

Next, as is shown in the cross-sectional view of FIG. 9, there is deposited over a top surface of the membrane layer 20 a layer that will be patterned to serve as a mask layer 28. The mask layer 28 typically is of a material and thickness to scatter electrons to sufficient angles that it intercepts where unpatterned to be useful in electron beam lithography, but allows electrons to pass through the openings in the pattern little impeded. Examples include tungsten, and tantalum silicon nitride, about 300 Angstroms thick.

Next, the mask layer 28 is patterned appropriately in any suitable manner. Typically this is done by first coating it with a standard electron beam resist, and then patterning the resist coating in the desired mask pattern with an electron beam. Then this mask pattern is transferred in the usual manner from the resist coating into the mask layer 28, after which the resist coating is removed to leave a patterned mask layer 28 as a coating on the membrane.

Figure 10:
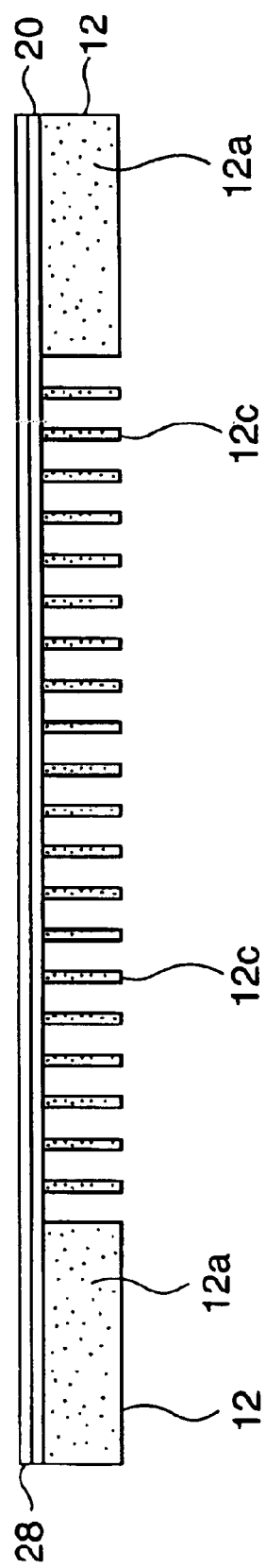
FIG. 10 shows the section of FIG. 8 after the fill has been removed from the windows.

Now, there is removed the fill material from the windows 18a and 18b to open them. The result is shown in FIG. 10 in which the fill has been removed from the windows 18a and 18b formed between the major and minor struts 12b and 12c and the mask layer 28 has been patterned to serve as a mask. Advantageously the fill material was suitably chosen to permit its easy removal, as by wet chemical etching without damage to the mask. In some instances, it may be possible to remove the fill in the same process used to remove the unneeded portions of the mask layer. In specific cases, the fill may have been removed just before the mask layer was patterned, unless the additional support the fill provides was still needed during the patterning.

This results in a mask support assembly with a mask layer 28 thereon.

It can be appreciated that a fraction different from one half, for example a third, appropriately chosen to maintain adequate rigidity, of the total number of windows to be cut, can be cut (formed) and filled in separate rounds during the formation of such windows. Additionally, it can be appreciated that rather than a fraction of the total number of windows to be formed can be cut and filled in each round, a fraction of the area of each window to be formed can be instead cut and filled in successive rounds, to maintain the desired strength of the substrate during the window-cutting steps.

Figure 7:
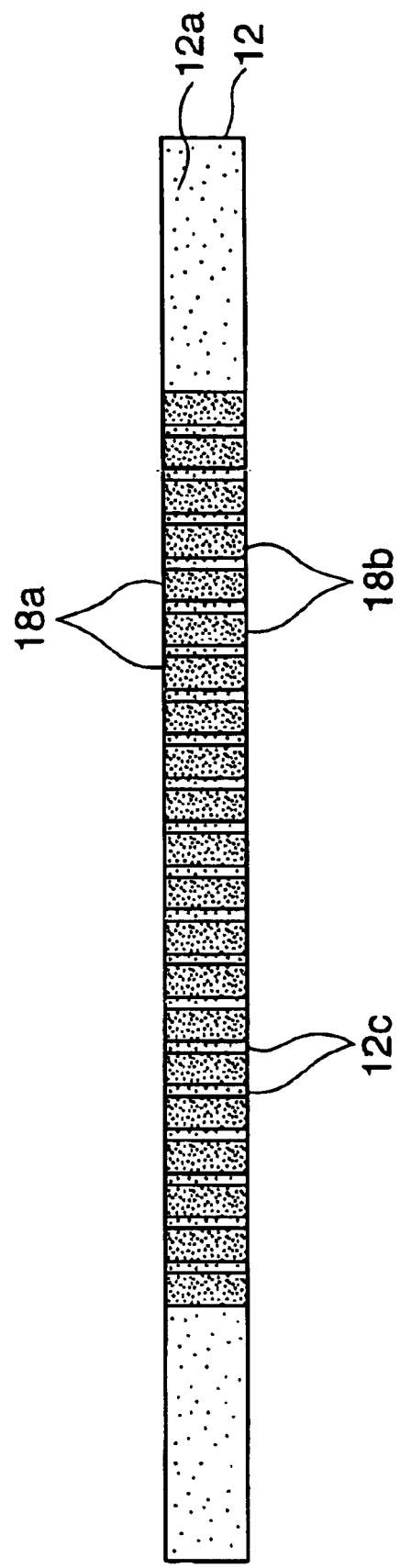
FIG. 7 shows a cross sectional view taken along a dashed line 7—7 of FIG. 6.
Figure 11:
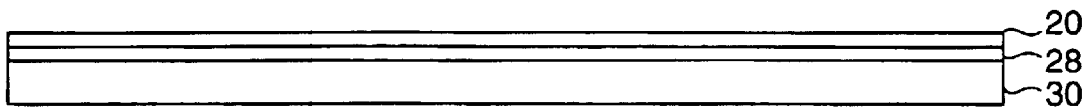
FIGS. 11–14 show cross sectional views that illustrate an alternative method for providing the membrane and mask layers over a mask support structure of the kind shown in FIG. 7.

As was also mentioned above, various other methods consistent with the invention can be used to provide a membrane layer 20 for supporting the mask layer 28 on the mask support structure 10 shown in FIG. 7. For example, in another method there is prepared a suitable second substrate 30, for example, of silicon, typically of the same size and shape as the substrate 12. As shown in FIG. 11, one major surface of the substrate 30 is covered in turn with an underlying layer of a thickness and material suited for use as the mask layer 28 and an overlying layer of a size and material suitable for use as the membrane layer 20.

Figure 12:
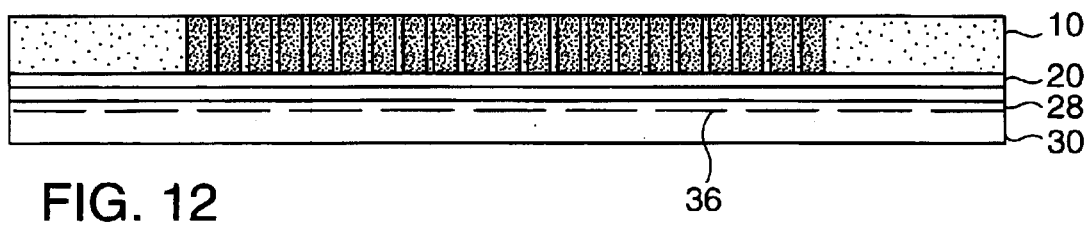

Then, as is shown in FIG. 12, the second substrate 30 is bonded by way of its membrane layer 20 to a major surface of the filled-window mask support structure 10 of FIG. 7 by any suitable means, as by plasma activation bonding (not shown) or the use of an adhesive layer (not shown).

Figure 13:
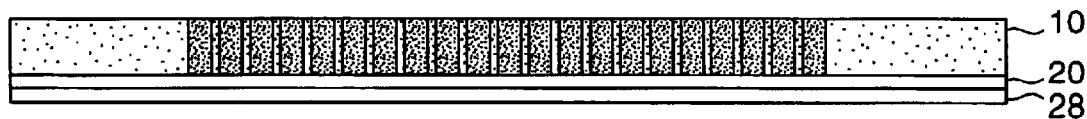

Then there is removed the second substrate portion 30, as by etching, to leave the structure shown in FIG. 13, in which mask layer 28 is exposed, supported on the first substrate 12 by way of the membrane layer 20.

There can now be patterned the exposed mask layer 28, in the manner previously described.

Figure 14:
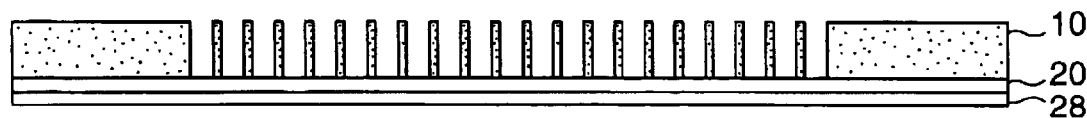

There can now be removed the fill in the supporting grillage to leave the structure shown in FIG. 14, which is the structure desired for mask assembly.

To facilitate the removal of the second substrate 30, it can be ion-implanted before bonding to the mask support structure 10, to form a defect-rich buried layer in its interior. The ions could, for example, be hydrogen or oxygen. This makes it is easy to cleave the substrate 30 along such defect-rich layer. The cleaving of the substrate 30 can appreciably thin the substrate 30 and thus facilitates its subsequent complete removal to expose the layer that is to form the mask layer 28. The dashed line 36 across substrate 30 in FIG. 12 illustrates the location of such an optional ion-implanted layer within substrate 30.

Figure 15:
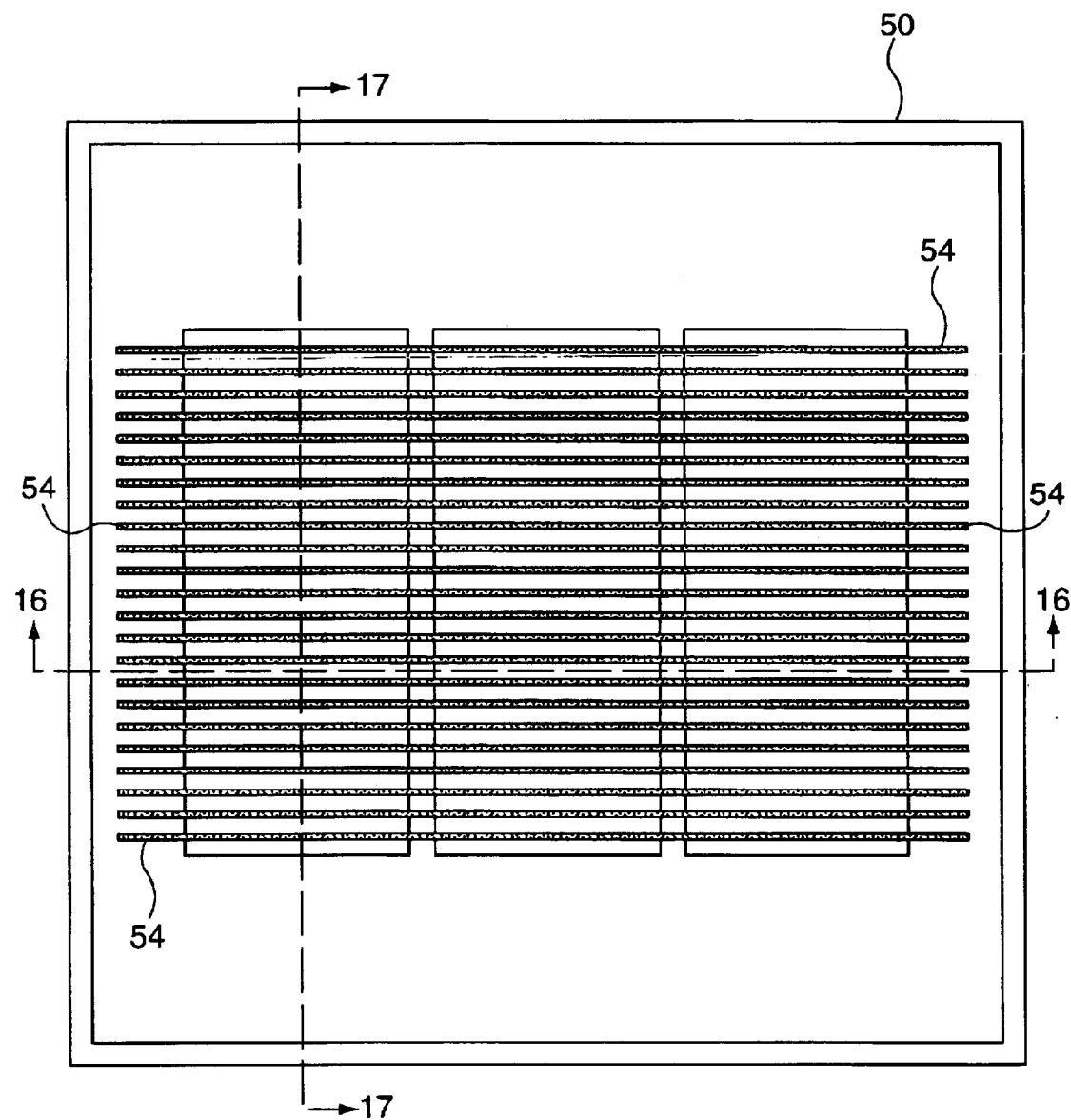
FIGS. 15, 16, and 17 shown a top view, a first cross-sectional view through a dashed line 51—51 of FIG. 15, and a second cross-sectional view through, a dashed line 52—52 of FIG. 15 of a mold useful in the production of a mask support structure in accordance with another embodiment of the invention.
Figure 16:
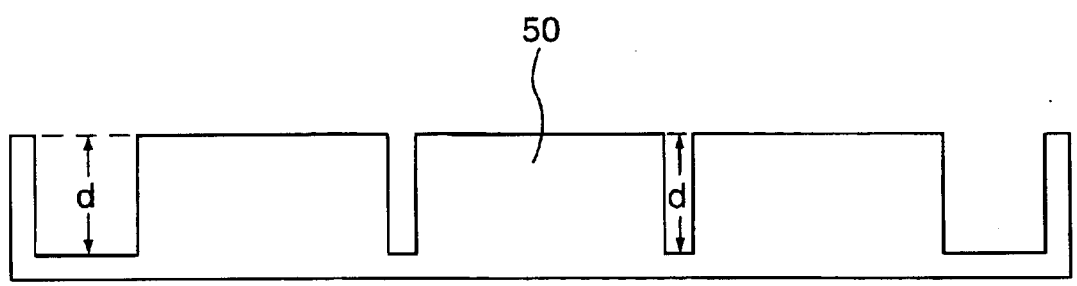
Figure 17:
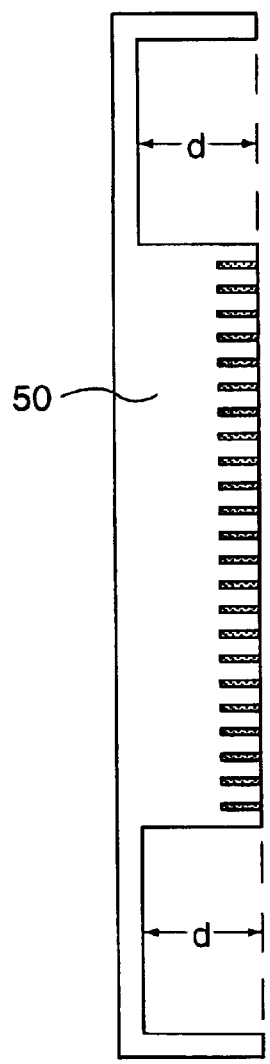

Referring now to FIGS. 15, 16, and 17, there are shown a top view (FIG. 15), a first cross-sectional view (FIG. 16) through a dashed line 16—16 of FIG. 15, and a second cross-sectional view (FIG. 17) through a dashed line 17—17 of FIG. 15 of a mold 50 useful for forming a support structure in accordance with another embodiment of the invention. The mold includes wide openings for defining the major struts and narrower openings (grooves) for defining the minor struts. A plurality of parallel minor struts (elongated strips) 54 have been placed in the grooves of the mold 50. When mold 50 is filled with a molding material, the molding material attachs itself to minor struts 54. Grooves in the mold 50 have a depth (height) of "d" (See FIGS. 16 and 17). Minor struts 54, which typically has a depth less than "d", can optionally be of the same depth (height) d as the grooves in the mold 50. The material for the minor struts 54 and the mold-filling material can be the same or different materials. After the fill material hardens a mask support structure 100 (see FIG. 18) is formed in the mold 50.

Figure 18:
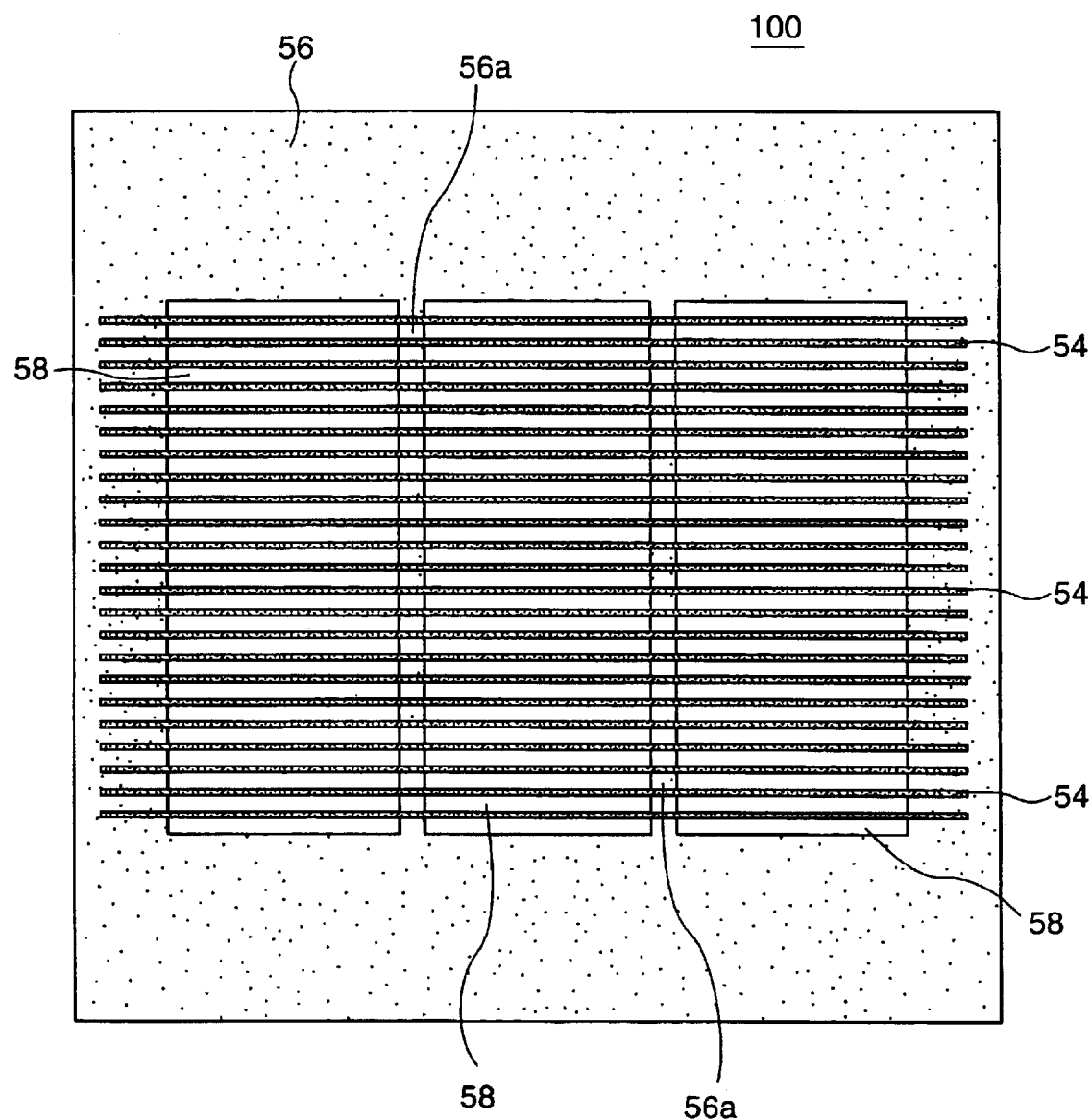
FIG. 18 shows the resulting mask support structure after it is removed from the mold.

FIG. 18 shows the mask support structure 100 after there has been removed from the mold 50. Mask support structure 100 has a frame 56 comprising major struts 56a and minor struts 54 that define rows and columns of an array of openings (windows) 58. Mask support structure 100 is similar to mask support structure 10 of FIG. 1. It is then advantageously filled with a temporary fill (not shown) and then opposite major surfaces are planarized. Mask support structure 100 is then used as a support for a membrane layer and a mask layer in essentially the same manner as explained previously for support structure 10 of FIG. 1. Still another method of forming a suitable mask support structure for use in the invention is described below with reference to FIGS. 19 and 20.

Figure 19:
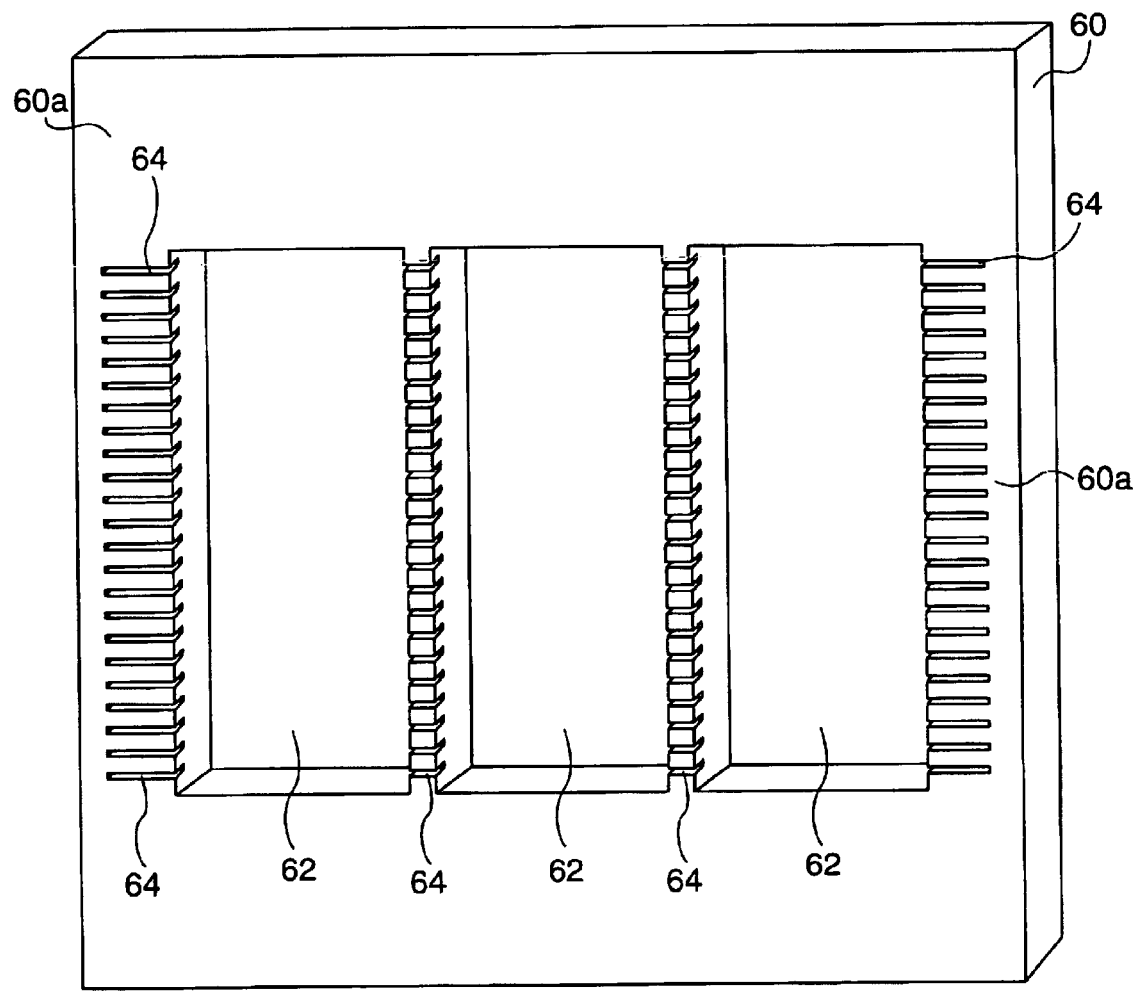
FIG. 19 shows a three-dimensional view of a mask support structure in an early stage of fabrication in accordance with another embodiment of the present invention.

Referring now to FIG. 19, there is shown a three-dimensional view of a frame 60 which has a plurality of spaced apart large rectangular opening 62 formed therethrough. Only three openings 62 are shown. Frame 60 is useful for forming a support structure in accordance with an other embodiment of the invention. A plurality of parallel grooves 64 are formed that extend across the frame including the regions between openings 62. Grooves 64 can optionally be of the same depth (height) as the openings 62.

Figure 20:
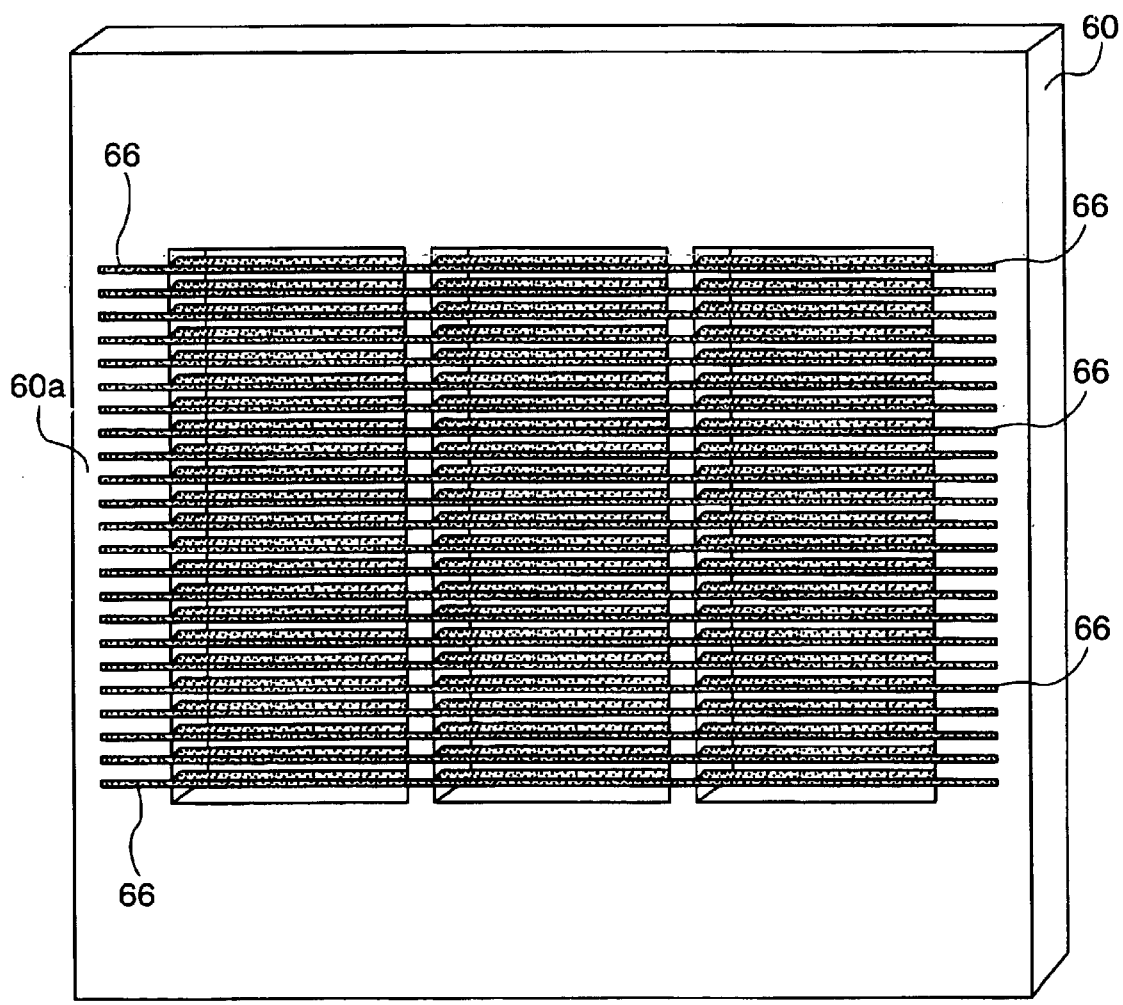
FIG. 20 shows the mask support structure of FIG. 19 at a succeeding stage of fabrication.

Referring now to FIG. 20, a separate minor strut 66 is inserted into each of the groves 64 to divide the large openings and to form a mask support structure 1000 in accordance with an other embodiment of the invention. Mask support structure 1000 of FIG. 20 is similar to support structure 10 of FIG. 1 and to mask support structure 100 of FIG. 18 and can be used in the manner previously described for such mask support structures. It is then advantageously filled with a temporary fill (not shown) and then opposite major surfaces thereof are planarized. Mask support structure 1000 is then used as a support for a membrane layer and a mask layer in essentially the same manner as explained previously for mask support structure 10 of FIG. 1.

Figure 21:
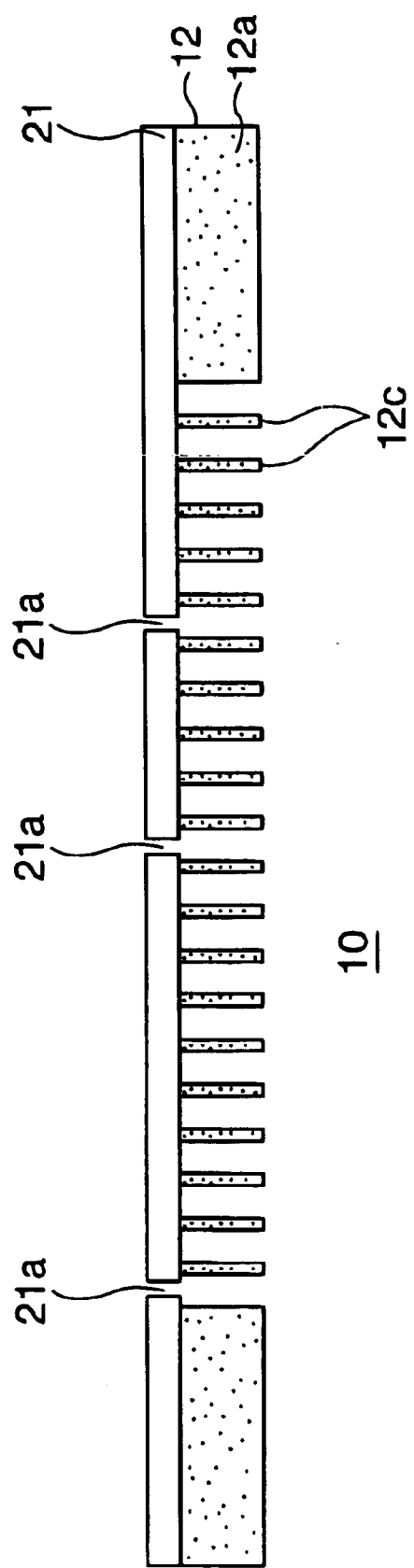
FIG. 21 shows a cross-sectional view taken along a dashed line 2—2 of FIG. 1 with a stencil mask over the mask support structure.

Referring now to FIG. 21, there is shown a cross-sectional view of the mask support structure 10 of FIG. 1 with a stencil mask 21 over a top surface of support structure 10. Stencil mask 21 serves same the purpose as membrane layer 20 (shown in FIG. 2) and the mask layer 28 shown in FIGS. 9–14 and can be substituted for membrane layer 20 and mask layer 28. Stencil mask 21 has formed therethrough a plurality of openings 21a which define a pattern. Stencil mask 21 can be used with the mask support structure 100 of FIG. 18 and with the mask support structure 1000 of FIG. 19.

It can be appreciated that the principles of the invention are essentially independent of the specific materials employed and of the specific dimensions described. For example, subsequent developments in materials and in cutting and filling techniques will likely affect what is preferred in the future. Still further, it should be apparent that in the embodiment involving successive rounds of cutting and filling that it may not be necessary to interleave all of the window opening of different rounds since it should be feasible in some instances to include in the same cutting round pairs or more of adjacent windows of the window pattern desired.

What is claimed is:

1. A method of forming a mask assembly for use in lithography comprising the steps of:
   forming a support structure that comprises a substrate that includes an initial plurality of windows;
   filling the initial plurality of windows with a temporary fill material;
   forming an additional plurality of windows in portions of said substrate which do not contain the temporary fill material;
   filling the additional plurality of windows in the substrate with a temporary fill material;
   forming over the filled-windowed substrate a mask; and
   essentially completely removing the temporary fill material.

2. The method of claim 1 wherein the mask comprises a membrane layer covered by a mask layer.

3. The method of claim 1 wherein the mask is a stencil mask.

4. A method of forming a mask assembly for use in lithography comprising the steps of:
   a) forming a support structure that comprises a substrate that includes a first plurality of windows;
   b) filling the first plurality of windows with a temporary fill material;
   c) forming an additional plurality of windows in portions of said substrate which do not contain the temporary fill material;
   d) filling the additional plurality of windows in the substrate with a temporary fill material;
   e) forming over the filled-windowed substrate a membrane layer capable of supporting a mask layer;
   f) forming a mask layer over the membrane layer; and
   g) essentially completely removing the temporary fill material.

5. The method of claim 4, wherein steps c) and d) are repeated at least once.

6. The method of claim 5 in which the windows are in a two dimensional array of rows and columns and in which the first plurality of windows consists of alternate windows in each row and column.

7. A method of forming a mask assembly comprising the steps of:
   forming in a substrate a support structure major and minor struts that define an array of windows, in the form of a two-dimensional array of rows and columns, by successive rounds of cutting in the substrate a fraction of the total window area to be formed;
   filling such fraction of windows with a temporary fill material before the succeeding round of cutting until all the window areas are cut and filled;
   forming a membrane layer over a top surface of the support structure;
   forming a mask layer over the membrane layer; and
   essentially completely removing the fill material from the windows.

8. The method of claim 7 in which a first round of cutting involves cutting approximately one half of the windows to be cut and a second round involves the remainder.

9. The method of claim 8 in which the first round of cutting is of alternate windows in each row and column.

10. The method of claim 4 in which the support structure is formed by the steps of:
    placing in a mold which is shaped to facilitate the formation of a support structure a plurality of parallel minor struts; and
    forming in the mold a support structure that comprises a frame and plurality of major struts that are orthogonal and attached to the minor struts with the major and minor struts defining a plurality of windows arranged in a two dimensional array of rows and columns.

11. The method of claim 10 further comprising the step of removing the support structure from the mold.

12. A method of forming a mask assembly for use in lithography, comprising the steps of:
    a) forming a support structure that comprises a substrate that includes a first plurality of windows;
    b) filling the first plurality of windows with a temporary fill material;
    c) forming an additional plurality of windows in portions of said substrate which do not contain the temporary fill material;
    d) filling the additional plurality of windows in the substrate with a temporary fill material;
    e) forming over a surface of a second substrate a layer suitable for a mask layer, followed by a layer suitable for a membrane layer;
    f) bonding the membrane layer to the filled, windowed substrate; and
    g) removing selectively the second substrate to expose the mask layer.

13. The method of claim 12 in which the second substrate is implanted with ions to create in its interior an ion-implanted region adjacent one major surface of the second substrate, which one surface is opposite a second major surface to which said mask layer and said membrane layer are applied, and wherein the second substrate is removed in part by cleaving along the ion-implanted region.

14. A method of forming a mask assembly for use in electron beam lithography comprising the steps of:
    forming in a substrate a first set of spaced-apart windows;
    filling the windows with a temporary fill material;
    forming in the substrate a second set of windows in the spaces between the first set of windows, thereby forming in combination with the first set of spaced-apart windows a two-dimensional array of windows arranged in rows and columns;
    filling the second set of windows with a temporary fill material;

depositing over the filled-windowed substrate a layer suitable for supporting a mask;

depositing over the layer suitable for forming a mask an additional layer suitable for providing a mask;

patterning the layer suitable for providing a mask, to form a mask; and removing the temporary fill from the windows.

15. The method of claim 14 in which the substrate is selected from the group consisting of aluminum oxide and silicon carbide, the layer suitable for supporting a mask comprises a material selected from the group consisting of silicon, silicon nitride, silicon carbide, diamond, and aluminum oxide, and the mask is selected from the group consisting of tungsten and tantalum silicon nitride.

16. The method of claim 14 in which the major surfaces of the filled-windowed substrate are planarized and made parallel before the deposition of the layer suitable for supporting a mask.

17. A method of forming a mask support structure, comprising the steps of:

forming in a substrate a set of windows spaced apart by major strut portions;

forming a plurality of spaced apart grooves in the major strut portions of the substrate; and placing one of a plurality of minor strut elongated strips in each of the spaced apart grooves.

18. A method of forming a mask assembly comprising the steps of:

forming a molded support structure that defines an array of open windows arranged in rows and columns, wherein said molded support structure comprises a frame and major and minor struts which form said array of open windows, and wherein said major struts are orthogonal to minor struts, with said minor struts being placed into a mold prior to forming of said major struts and said frame which supports said major and minor struts;

filling the window openings with a temporary fill material;

forming over the support structure a membrane layer;

forming over the membrane layer a patterned mask; and removing the temporary fill material.

19. A method of forming a mask support structure comprising the steps of:

forming in a substrate a first set of spaced apart windows; followed by filling the first set of windows with a temporary fill material; followed by forming in the substrate a second set of windows located in portions of the substrate adjacent to the first set of filled windows; followed by filling the second set of windows with a temporary fill material.

20. A method of forming a mask support structure comprising the steps of:

placing in a mold which is shaped to facilitate the formation of a mask support structure a plurality of parallel minor struts;

forming in the mold a mask support structure that comprises a frame and plurality of major struts, where the major struts are orthogonal and attached to the minor struts with the major and minor struts defining a plurality of open windows arranged in a two dimensional array of rows and columns; and filling the open windows with a temporary fill material.

\* \* \* \* \*